United States Patent [19]
Kusunoki et al.

[11] Patent Number: 5,476,737
[45] Date of Patent: Dec. 19, 1995

[54] METHOD OF FORMING A PHOSPHOR SCREEN OF A CATHODE RAY TUBE

[75] Inventors: Tsuneo Kusunoki, Kanagawa; Norihiro Tateyama, Chiba; Katsutoshi Ohno, Tokyo, all of Japan

[73] Assignee: Sony Corporation, Tokyo, Japan

[21] Appl. No.: 293,185

[22] Filed: Aug. 19, 1994

Related U.S. Application Data

[62] Division of Ser. No. 34,890, Sep. 19, 1993, abandoned.

[30] Foreign Application Priority Data

Mar. 25, 1992 [JP] Japan .................................. 4-067571

[51] Int. Cl.⁶ .................................................... G03C 5/00
[52] U.S. Cl. ................. 430/23; 430/25; 430/26; 430/27; 430/28
[58] Field of Search ........................ 430/23, 25, 27, 430/28

[56] References Cited

U.S. PATENT DOCUMENTS 5,134,047  7/1992  Inada et al. ........................... 430/23
5,366,834  11/1994  Yoneda et al. ........................ 430/23

Primary Examiner—S. Rosasco
Attorney, Agent, or Firm—Hill, Steadman & Simpson

[57] ABSTRACT

A phosphor screen (10) formed of respective color phosphor layers (9R), (9G), (9B) and respective color filter layers (4R), (4G), (4B) is formed on the inner surface of the panel (1). In that case, the respective color filter layers (4R), (4G), (4B) are respectively formed between the inner surface of the panel (1) and the phosphor layers (9R), (9G) and (9B). Therefore, the color cathode ray tube can be made high in contrast and in brightness.

2 Claims, 3 Drawing Sheets

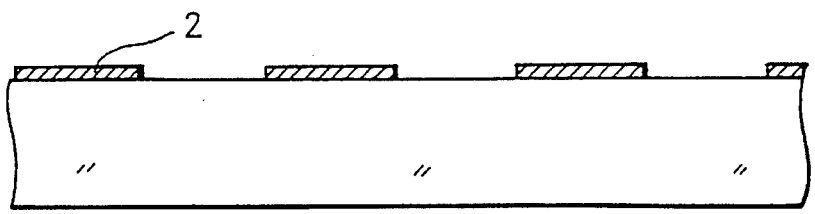
FIG. 2A
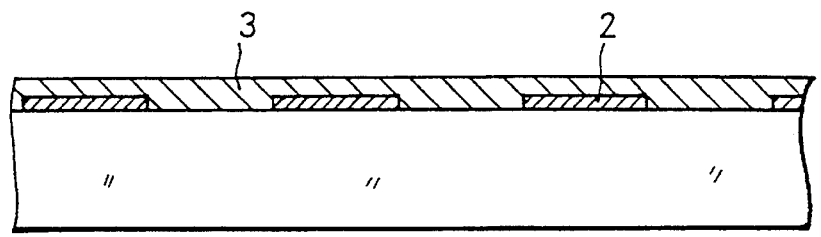
FIG. 2B
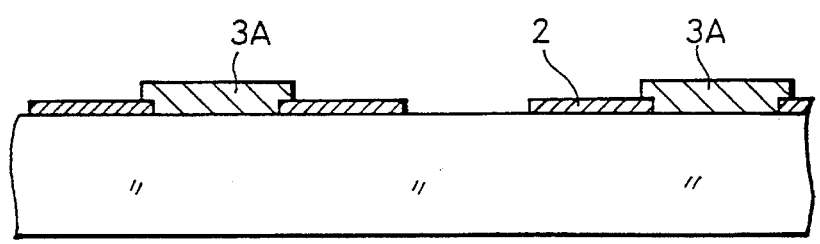
FIG. 2C
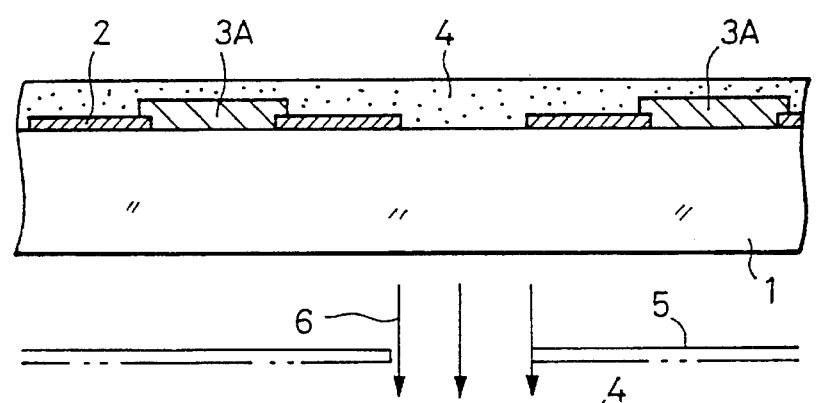
FIG. 2D
FIG. 2E
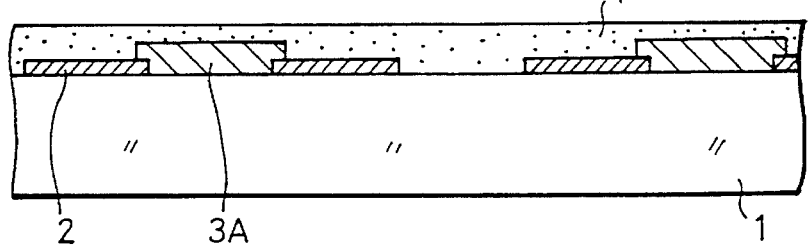
FIG. 2F
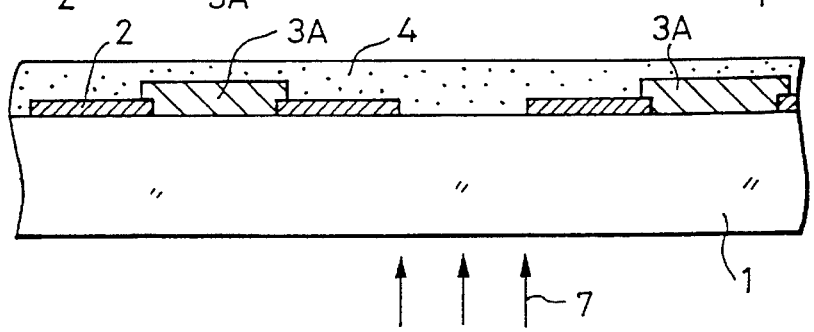

METHOD OF FORMING A PHOSPHOR SCREEN OF A CATHODE RAY TUBE

This is a division of application Ser. No. 08/034,890, filed Sep. 19, 1993, now abandoned.

BACKGROUND OF THE INVENTION

1. Field of the Invention

The present invention relates to a cathode ray tube and a method of forming a phosphor screen of the cathode ray tube.

2. Description of the Related Art

As a color cathode ray tube of high contrast, there is known a color cathode ray tube in which a glass panel forming a part of a cathode ray tube body, i.e., a panel having a phosphor screen formed on its inner surface is made of a dark glass having a transmittance of about 40 to 50% or a color cathode ray tube in which such a phosphor screen is employed that has formed on its inner surface a so-called pigment phosphor using a pigment whose color is the same color of the phosphor deposited on phosphor particles.

In the former color cathode ray tube in which the panel is formed of the dark glass, an external light is absorbed by the dark glass so that a contrast thereof can be increased. At the same time, however, a light emitted from the phosphor screen also is absorbed by the dark glass so that a brightness thereof is lowered.

In the latter cathode ray tube in which the phosphor screen is formed by using the pigment phosphor, an external light is absorbed by the pigment so that a contrast thereof can be increased. In this case, however, phosphor particles of several layers (e.g., three to four layers) are laminated to form the phosphor screen. As a result, a light from the phosphor particle is partly absorbed by the pigment with the result that a brightness thereof is lowered 10 to 15%.

OBJECTS AND SUMMARY OF THE INVENTION

Therefore, it is an object of the present invention to provide an improved cathode ray tube in which the aforesaid shortcomings and disadvantages of the prior art can be eliminated.

It is an object of the present invention to provide an improved method of forming a phosphor screen of a cathode ray tube in which the aforesaid shortcomings and disadvantage of the present invention can be eliminated.

More specifically, it is an object of the present invention to provide a cathode ray tube in which a contrast and a brightness can both be increased and a method of forming the same.

According to a first aspect of the present invention, there is provided a cathode ray tube which comprises a panel, and a phosphor screen formed of a phosphor layer and a color filter layer, the phosphor screen being formed on an inner surface of the panel, wherein the color filter layer is formed between the phosphor layer and the inner surface of the panel.

According to a second aspect of the present invention, there is provided a method of manufacturing a phosphor screen of a cathode ray tube which comprises the steps of coating a first photo-resist layer on all area except a predetermined location of an inner surface of a panel of the cathode ray tube, coating a second photo-resist layer dispersed with pigment particle on the first photo-resist layer and the predetermined location, exposing the second photo-resist layer on the predetermined location from an opposite side of the panel, dissolving the first photo-resist layer and removing the second photo-resist layer on the first photo-resist layer so as to form a color filter layer on the predetermined location, and forming a phosphor layer on the color filter layer.

In accordance with a third aspect of the present invention, there is provided a method of forming a phosphor screen of a cathode ray tube which comprises the steps of forming a photo-resist layer made of a polyvinyl alcohol-ammonium dichromate-based photosensitive liquid on all areas except a predetermined location of an inner surface of a panel of the cathode ray tube, coating a suspension in which a predetermined pigment is dispersed into a polyvinyl alcohol-stilbazolium-based photosensitive liquid on the photo-resist layer to form a color filter coating film, exposing the color filter coating film on the predetermined location from an outer surface of the panel, dissolving the photo-resist film by hydrogen peroxide water and developing the photo-resist film from an opposite side of the panel so as to form a color filter layer on the predetermined location, curing the color filter layer by a tannic acid solution, and neutralizing the color filter layer by an ammonium aqueous solution, wherein the processes are repeated so as to form other color filter layers on other predetermined locations.

The above and other objects, features, and advantages of the present invention will become apparent from the following detailed description of an illustrative embodiment thereof to be read in conjunction with the accompanying drawings, in which like reference numerals are used to identify the same or similar parts in the several views.

BRIEF DESCRIPTION OF THE DRAWINGS

FIGS. 2A through 2K are process diagrams showing an embodiment of a method of forming a phosphor screen of a cathode ray tube according to the present invention, respectively.

DETAILED DESCRIPTION OF THE PREFERRED EMBODIMENTS

The present invention will hereinafter be described with reference to the drawings.

Figure 1:
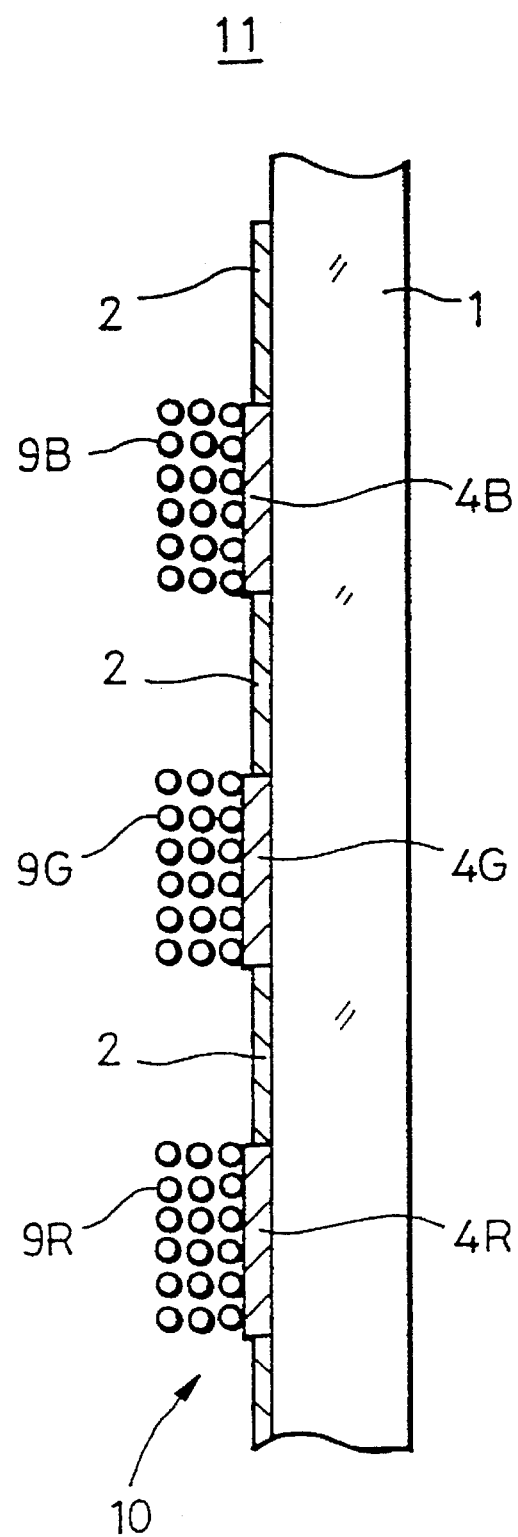
FIG. 1 is a cross-sectional view showing a main portion of an embodiment of a cathode ray tube according to the present invention.

In the embodiment of the cathode ray tube according to the present invention, as shown in FIG. 1 of the accompanying drawings, a panel 1 of a cathode ray tube envelope is made of a glass having a high transmittance (e.g., about 90%). Light absorption layers 2 of predetermined pattern, e.g., black stripes 2 are formed on the inner surface of the panel 1. Color filter layers containing fine particle inorganic pigments, e.g., a green filter stripe 4G, a blue filter stripe 4B and a red filter stripe 4R are deposited between the corresponding black stripes 2. Phosphor layers for emitting lights of their own colors, e.g., a green phosphor stripe 9G, a blue phosphor stripe 9B and a red phosphor stripe 9R are respectively formed on the respective color filter stripes 4G, 4B and 4R. Then, the respective color phosphor stripes 9G, 9B and 9R and the respective color filter stripes 4G, 4B and 4R formed thereunder constitute a color phosphor screen 10 to thereby construct a color cathode ray tube 11.

A method of forming the color phosphor screen 10 according to the embodiment of the present invention will be described below.

As shown in FIG. 2A, black stripes (light absorption layers) 2 of predetermined pattern are formed on the inner surface of the panel 1.

The black stripes 2 are formed as follows. A photosensitive film made of polyvinyl alcohol (PVA) and ammonium dichromate (ADC), for example, is coated on the inner surface of the panel 1, dried, exposed with ultraviolet rays by using a color selecting electrode as a photo mask (exposed three times in response to red, green blue colors while changing the position of a light source relatively), and developed by the rinsing process using water to thereby form stripe-shaped photo-resist layers at positions corresponding to the respective colors. Then, a carbon slurry is coated on the whole surface including the photo-resist layers, dried and developed from the opposite side (i.e., removing the photo-resist layers and carbon layers formed on the photo-resist layers) to thereby form carbon stripes of predetermined pattern, i.e., black stripes 2.

Then, as shown in FIG. 2B, a first photo-sensitive liquid, i.e., PVA-ADC-based photosensitive liquid is coated on the whole surface and dried, thereby a PVA-ADC-based photosensitive film 3 being formed.

Then, as shown in FIG. 2C, by using the color selecting electrode as the photo mask, the photosensitive film 3 located at blue and red positions are exposed with ultraviolet rays and developed by the rinsing process using hot water to thereby form masking photo-resist films 3A at blue and red positions except the green position.

A second photosensitive liquid, in this embodiment, a suspension (slurry) having the following composition where a fine particle inorganic green pigment is dispersed into a PVA-SBQ-based photosensitive liquid is coated on the whole surface to thereby form a green filter coating film 4 as shown in FIG. 2D.

| COMPOSITION | |
|---|---|
| green pigment (TiO$_2$.ZnO.CoO.NiO) (manufactured by DAINICHISEIKA COLOR AND CHEMICALS CORP. under the trade name of DAIPYROXIDE) | 5.0 weight % |
| organic-based photosensitive agent (PVA-SBQ-based manufactured by OHJI KAKO K.K under the trade name of KIP) | 3.0 weight % |
| surface-active agent | 0.1 weight % |
| water | 81.7 weight % |

As shown in FIG. 2E, the coating film 4 corresponding to the green position is exposed with ultraviolet rays from the inner surface of the panel 1 by using a color selecting electrode 5 as a photo mask. That is, a so-called inner surface exposure 6 is carried out.

Then, as shown in FIG. 2F, the coating film 4 corresponding to the green position is exposed with ultraviolet rays from the outer surface of the panel 1 by using the black stripe 2 as the photo mask. That is, a so-called outer surface exposure 7 is carried out. An adhesive property of the coating film 4 to the panel 1 can be increased by the outer surface exposure 7. Then, a non-exposed portion is rinsed by hot water.

Figure 2G:
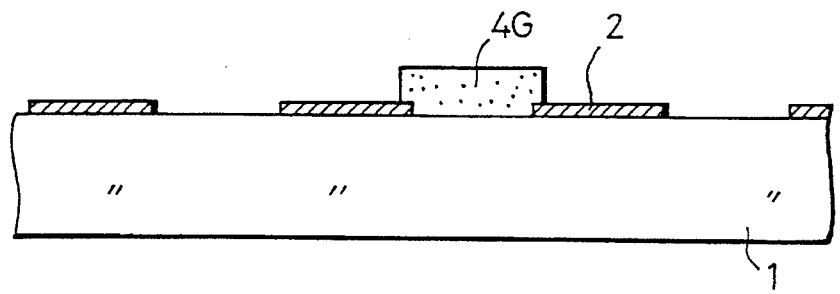

Then, the PVA-ADC-based photo-resist film 3A is decomposed by hydrogen peroxide water (H$_2$O$_2$ 10 weight %) and developed from the opposite side by using hot water, whereby the green filter layer, i.e., green filter stripe 4G in contact with the inner surface of the panel 1 is formed as shown in FIG. 2G.

Figure 2H:
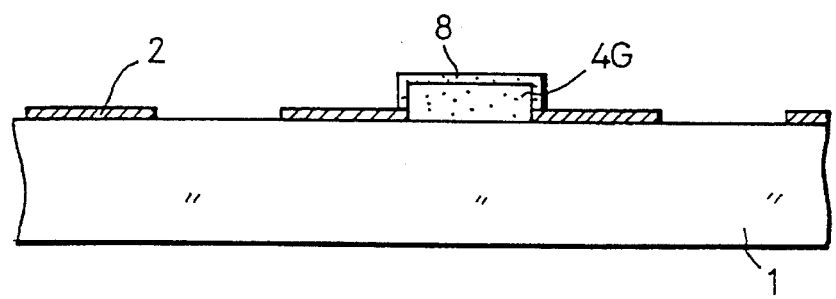

Then, as shown in FIG. 2H, the green filter stripe 4G is subjected to a curing treatment 8 by a solution of tannic acid of 0.1 weight %. The green filter stripe 4G is neutralized by ammonium aqueous solution (1.0 weight % of ammonium) after the curing treatment. Then, the green filter stripe 4G is rinsed by hot water and thus the green filter stripe 4G is formed.

Figure 2I:
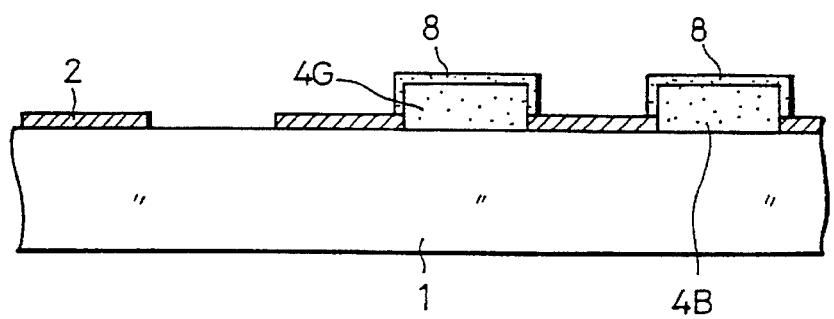
Figure 2J:
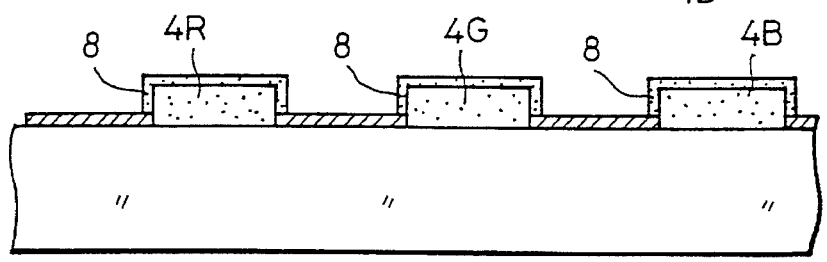

Similar processes (processes from FIGS. 2B to 2H) are repeated to form the blue filter stripe 4B at the blue position as shown in FIG. 2I. Further, the red filter stripe 4R is formed at the red position as shown in FIG. 2J.

As the fine particle inorganic blue pigment used in the blue filter stripe 4B, there can be used DAIPYROXIDE TM BLUE #3410 (trade name and made of CoO.Al$_2$O$_3$). As the fine particle inorganic red pigment used in the red filter stripe 4R, there can be utilized ferric oxide (transparent red oxide of iron), Cd (S, Se) or the like.

Figure 2K:
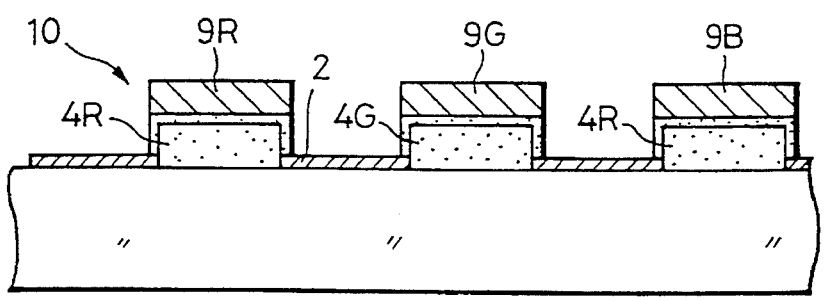

Then, as shown in FIG. 2K, the green phosphor stripe 9G, the blue phosphor stripe 9B and the red phosphor stripe 9R are respectively formed on the green filter stripe 4G, the blue filter stripe 4B and the red filter stripe 4R by the ordinary slurry method. Thereafter, though not shown, an acryl layer that is an intermediate layer is coated and a metal-backing layer made of Al or the like is formed. Thus, there is obtained the desired color cathode ray tube 11 in which the phosphor screen 10 formed of a laminated member formed of the respective color filter stripes 4G, 4B and 4R and the respective color phosphor stripes 9G, 9B and 9R is formed on the inner surface of the panel 1 having the black stripes 2 of the predetermined pattern as shown in FIG. 1.

According to the color cathode ray tube 11 thus arranged, since the color filter stripes 4G, 4B and 4R are respectively formed between the respective color phosphor stripes 9G, 9B, 9R forming the phosphor screen 10 and the inner surface of the panel 1, the external light is absorbed by the color filter stripes 4G, 4B and 4R, whereby a color picture of high contrast can be obtained. At the same time, the panel 1 can be formed of the glass having high transmittance, e.g., glass whose transmittance is about 90%. Also, since the film thicknesses of the color filter stripes 4G, 4B and 4R are thin, the amount of light absorbed by the respective color phosphor stripes 9G, 9B and 9R is small. Further, since the color filter stripes 4G, 4B and 4R are thin, the amount of phosphor can be increased. Owing to the above multiplication effect thereof, the brightness of the color cathode ray tube can be increased as compared with the prior art.

When the respective color filter stripes 4G, 4B and 4R are formed, after the suspension in which the fine particle inorganic pigment is dispersed into the PVA-SBQ-based photosensitive liquid is coated on the inner surface of the panel 1, the coating film 4 is exposed with ultraviolet rays from the inner surface of the panel 1 (inner surface exposure 6) and then exposed with ultraviolet rays from the outer surface of the panel 1 (outer surface exposure 7). Therefore, there can be obtained a sufficient bonding strength between the respective color filter stripes 4G, 4B and 4R and the inner surface of the panel 1. Further, by one coating process, there can be formed the respective color filter stripes 4G, 4B, 4R having a predetermined optical characteristic, i.e., transmittance characteristic and reflection characteristic.

When the coating film 4 is exposed only by the inner surface exposure 6, a light (ultraviolet ray) necessary for cross-linking is absorbed by the pigment itself, the amount of ultraviolet rays that are passed through the bonding surface between the coating film 4 and the inner surface of the panel 1 is decreased and a loose failure occurs in the color filter stripes 4G, 4B and 4R. As a result, if the concentration of pigment is lowered and the coating is carried out a number of times, then there cannot be obtained the color filter stripes having predetermined transmittance characteristic and reflection characteristic.

According to the embodiment of the present invention, the color filter stripes 4G, 4B and 4R which can improve the aforesaid shortcomings and having a strong bonding strength with the panel 1 and excellent optical characteristic can be formed by one coating process.

Further, according to the embodiment of the present invention, since the respective color filter stripes 4G, 4B and 4R can be formed by utilizing the PVA-ADC-based photo-resist film 3A for masking according to the inversion development process, a so-called overlapping failure in which other pigments are overlapped on a predetermined pigment can be reduced.

In particular, since the PVA-SBQ-based photosensitive liquid is utilized as the photosensitive liquid into which there is dispersed the pigment and the PVA-ADC-based photosensitive liquid is utilized as the photosensitive liquid for the masking photo-resist film 3A, in the inversion treatment using a $H_2O_2$ liquid that is an inversion agent, the PVA-SBQ-based photosensitive liquid is not decomposed and only the PVA-ADC-based photosensitive liquid is decomposed. Therefore, a satisfactory inversion development can be carried out.

Further, since the product is treated by the tannic acid solution after the inversion development, the film strength of the color filter stripes 4G, 4b and 4R can be increased. Then, since the acid of the product is neutralized by the ammonium aqueous solution, the phosphor stripes that will be formed next can be prevented from being discolored.

While a combination of the inner surface exposure 6 and the outer surface exposure 7 is utilized as the exposure to the coating film 4 by the ultraviolet rays as described above, the present invention is not limited thereto and the ultraviolet ray exposure can be effected only by the outer surface exposure 7.

Further, while the present invention is applied to the color cathode ray tube having the phosphor screen formed of the phosphor stripes as described above, the present invention is not limited thereto and may be applied to a color cathode ray tube having a phosphor screen formed of phosphor dots.

Furthermore, while the present invention is applied to the color cathode ray tube as described above, the present invention is not limited thereto and may be applied to a phosphor screen of a single color cathode ray tube for projectors.

According to the present invention, since the phosphor screen is formed of the phosphor layers and the color filter layers, there can be provided a cathode ray tube having high contrast and high brightness.

Further, according to the present invention, the color filter layer that constructs one portion of the phosphor screen can be formed so as to have predetermined optical characteristics and an increased bonding strength with the inner surface of the panel. Therefore, it is possible to manufacture this kind of cathode ray tube having high reliability.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A method of manufacturing a phosphor screen of a cathode ray tube comprising the steps of:

coating a first photo-resist layer on all areas except a predetermined location of an inner surface of a panel of said cathode ray tube;

coating a second photo-resist layer dispersed with pigment particle on said first photo-resist layer and said predetermined location;

exposing said second photo-resist layer on said predetermined location from an opposite side of said panel;

dissolving said first photo-resist layer and removing said second photo-resist layer on said first photo-resist layer so as to form a color filter layer on said predetermined location; and forming a phosphor layer on said color filter layer.

2. A method of forming a phosphor screen of a cathode ray tube comprising the steps of:

forming a photo-resist layer made of a polyvinyl alcohol-ammonium dichromate-based photosensitive liquid on all areas except a predetermined location of an inner surface of a panel of said cathode ray tube;

coating a suspension in which a predetermined pigment is dispersed into a polyvinyl alcohol-stilbazolium-based photosensitive liquid on said inner surface of said panel to form a color filter coating film;

exposing said color filter coating film on said predetermined location from an outer surface of said panel;

dissolving said photo-resist film by hydrogen peroxide water and developing said photo-resist film from an opposite side of said panel so as to form a color filter layer on said predetermined location;

curing said color filter layer by a tannic acid solution; and neutralizing said color filter layer by an ammonium aqueous solution, wherein said processes are repeated so as to form other color filter layers on other predetermined locations.

\* \* \* \* \*